(12) United States Patent
Luich et al.

(10) Patent No.: US 6,528,842 B1
(45) Date of Patent: Mar. 4, 2003

(54) ELECTRONICALLY ERASABLE MEMORY CELL USING CMOS TECHNOLOGY

(75) Inventors: Thomas M. Luich, Puyallup, WA (US); David Byrd, Puyallup, WA (US)

(73) Assignee: Jet City Electronics, Inc., Seattle, WA (US)

( * ) Notice: Subject to any disclaimer, the term of this patent is extended or adjusted under 35 U.S.C. 154(b) by 0 days.

(21) Appl. No.: 10/036,326

(22) Filed: Dec. 31, 2001

(51) Int. Cl.[7] .............................................. H01L 29/788
(52) U.S. Cl. ........................ 257/315; 257/314; 257/316; 257/357; 257/369
(58) Field of Search ................................ 257/314–318, 257/321, 355–357, 368–369

(56) References Cited

U.S. PATENT DOCUMENTS

| | | | |
|---|---|---|---|
| 5,166,904 A | * | 11/1992 | Hazani ........................ 257/317 |
| 5,465,231 A | | 11/1995 | Ohsaki |
| 5,504,706 A | | 4/1996 | D'Arrigo et al. |
| 5,930,613 A | | 7/1999 | Schlais et al. |
| 6,100,560 A | | 8/2000 | Lovett |
| 6,191,980 B1 | | 2/2001 | Kelley et al. |

* cited by examiner

Primary Examiner—David Nelms
Assistant Examiner—Andy Huynh
(74) Attorney, Agent, or Firm—Seed I P Law Group PLLC

(57) ABSTRACT

An Electrically Erasable Programmable Read Only Memory (EEPROM) cell uses a single standard NMOS (or PMOS) transistor with its gate connected to a Metal-Insulator-Metal, or Poly-Insulator-Poly capacitor such that a floating gate is formed. The floating gate is programmed and erased via Fowler-Nordheim tunneling.

19 Claims, 5 Drawing Sheets

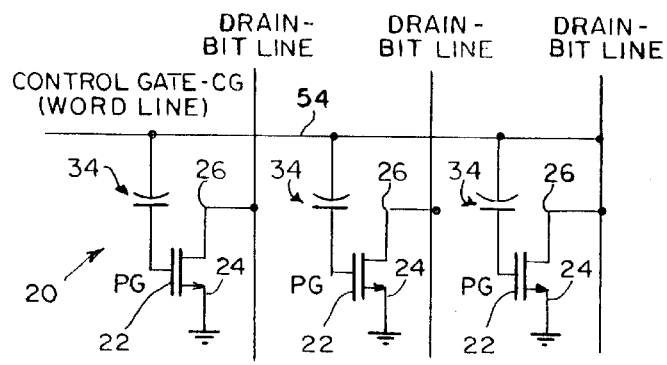
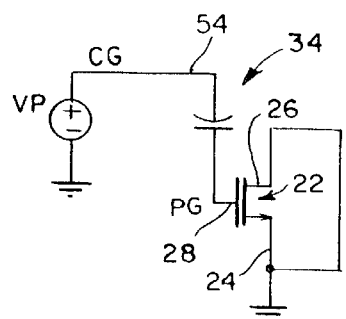
FIG. 5     FIG. 6
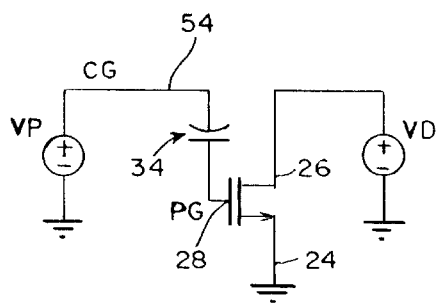
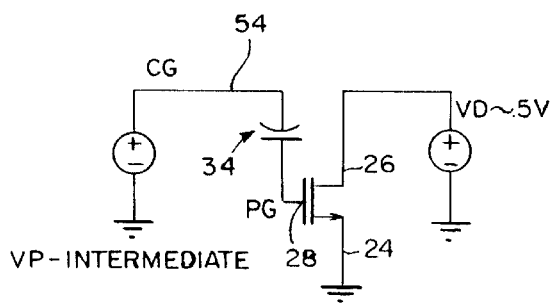
FIG. 7     FIG. 8

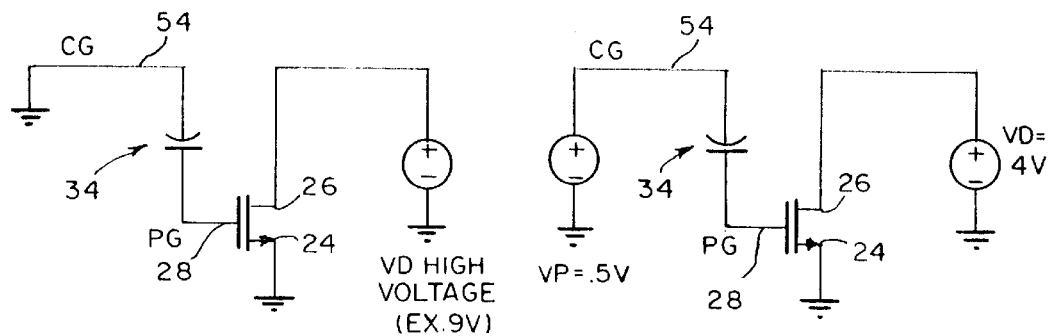
FIG. 9A    FIG. 9B
FIG. 10
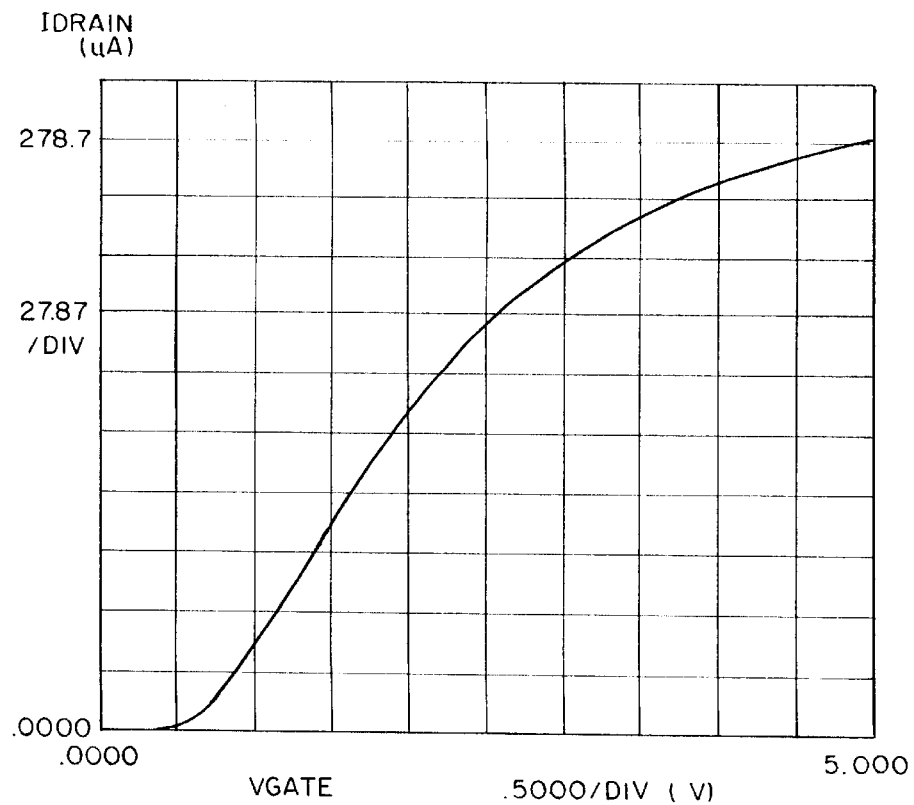

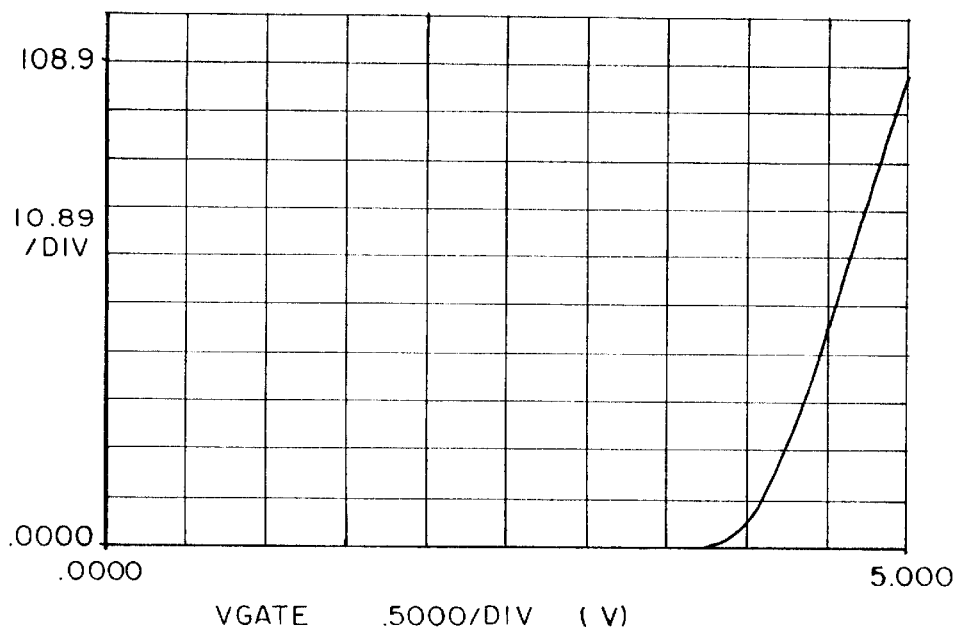
FIG. 11
FIG. 12
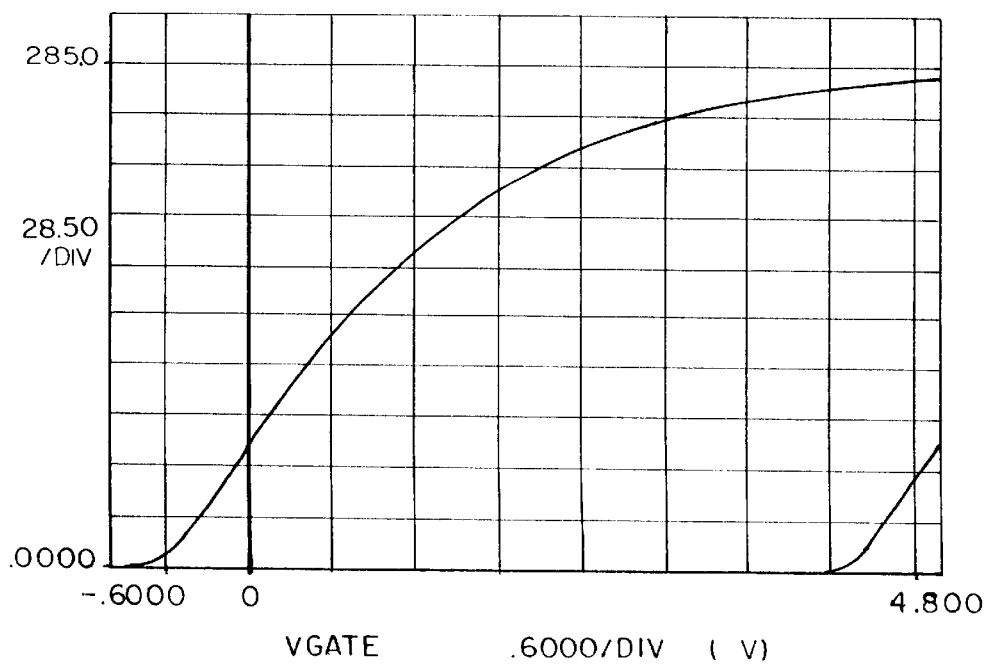

FIG. 13
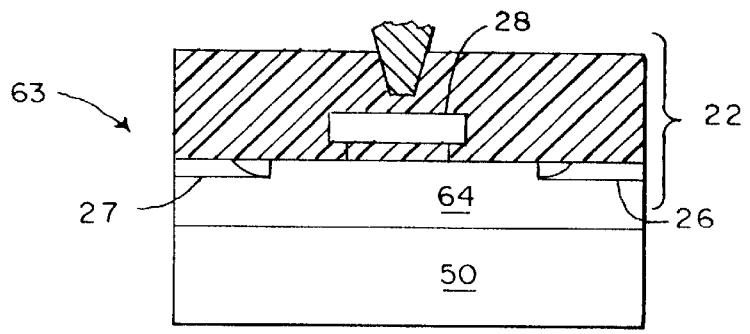
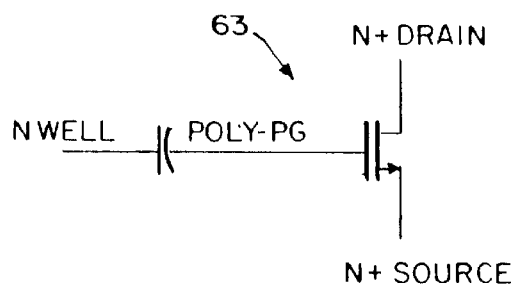
FIG. 14A
FIG. 14B
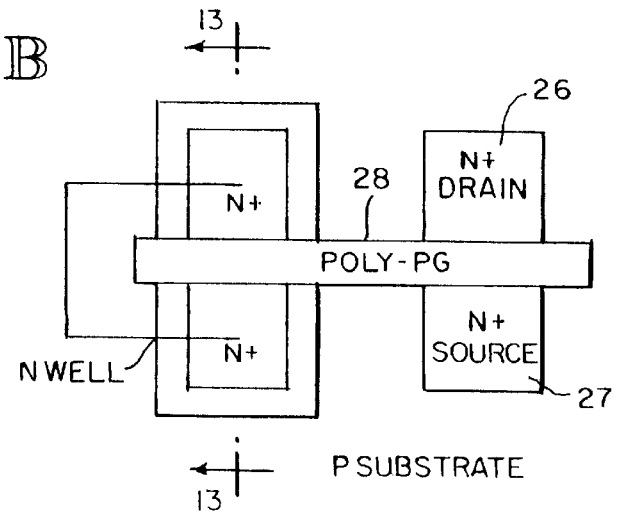

ELECTRONICALLY ERASABLE MEMORY CELL USING CMOS TECHNOLOGY

FIELD OF THE INVENTION

This invention relates to nonvolatile memory in integrated circuits. More specifically, the invention relates to Electrically Erasable Programmable Read Only Memory (EEPROM) semiconductor architectures.

BACKGROUND OF THE INVENTION

Nonvolatile memory has the advantage of being able to store data in the absence of a power supply. This property is useful for applications such as the storage of inputs used for control functions or program settings. Nonvolatile memory cells are of two general forms: electrically programmable read-only memory (EPROM) and electrically erasable and programmable read-only memory (EEPROM). Typically, these devices use two transistors to form an electrically isolated floating gate element which can store electrons in varying amounts. Conventional EEPROM architectures are shown in U.S. Pat. No. 5,465,231 to Ohsaki, "EEPROM and Logic LSI Chip Including Such EEPROM" issued Nov. 7, 1995; and U.S. Pat. No. 6,100,560 to Lovett, "Nonvolatile Cell" issued Aug. 8, 2000, the disclosures of which are incorporated herein by reference.

The EEPROM cells described in the above-referenced patents consist of a memory transistor having a floating gate that is capacitively coupled to a select gate. A thin oxide layer is typically used to insulate the floating gate from the drain of the memory transistor. The floating gate stores electrical charge in response to a voltage applied across the source and drain of the memory transistor and a second voltage applied across the source and drain of a second transistor. The floating gate can then be thought of as having two states: a "programmed" state (charged above a set level) and "unprogrammed" state (charged below the set level). Thus the floating gate functions can store binary information when floating gate charge is applied in the above manner as the charged state can represent a first binary state and the uncharged may be used to represent a second binary state.

The typical EEPROM is generally programmed and erased by charging or discharging the floating gate by applying appropriate voltages to the control gates and the substrate. The process is accomplished by using electron tunneling from an auxiliary conductor by use of the Fowler-Nordheim electron-tunneling mechanism (FN tunneling). FN tunneling is the quantum mechanical effect that allows electrons to pass through an energy barrier at the poly/oxide barrier. To allow for FN tunneling, the oxide layer in the first transistor is typically of a thickness of 100 Angstroms or less.

The programming function is performed by charging the floating gate with electrons. A relatively high electric potential is applied to the control gate of the selected memory cell transistor. This is sensed by the data read lines as a logical one or zero. The floating gate is then charged according to the FN tunneling effect. The accumulation of electrons at the floating gate increases the threshold voltage of the memory cell transistor. The EEPROM memory cell is erased by discharging the floating gate. A relatively high electrical potential with respect to the control gate is applied to the substrate and the floating gate discharges via FN tunneling. Data can thus be written into a selected memory cell transistor by performing either a program operation or an erase operation.

A disadvantage with current EEPROM technology is that it is generally not compatible with the standard complementary metal oxide semiconductor (CMOS) process. The typical EEPROM memory cell is shown in FIG. 1 and is generally indicated at reference numeral 10. The cell 10 consists of a stacked gate structure in which a floating gate (F.G.) 11 and a control gate (C.G.) 12 are stacked upon a singe transistor 13 by depositing a gate oxide layer 14 and the polycrystalline silicon (i.e., "polysilicon" or simply "poly") layer 11, followed by a second thin oxide 15 and poly layer 12, as in FIG. #1. Poly 1 is typically referred to as the floating gate 11, and poly 2 as the control gate 12. A metalization layer 17 penetrates the oxide layer 15 and controls the control gate 12. This prior art cell is suitable for high density memory applications, but is not generally compatible with standard CMOS technology. The standard CMOS process entails a one-layer polysilicon deposition step while the typical EEPROM cell requires two polysilicon deposition steps to form the floating gate 11 and control gate 12 as well as a step for the deposition of a thin oxide layer 14 between the two polysilicon layers 11, 12. These additional process steps are not appropriate for non-memory applications, and add to the expense in production of the cells. An example of a non-memory application is an analog circuit requiring only a small number of bits for trimming or device configuration. U.S. Pat. No. 5,930,613 to Schlais et al. describes an EPROM cell having a large lateral capacitor manufactured in accordance with standard CMOS processes. However, the architecture shown therein is not applicable to an EEPROM cell. Thus there is a need for an EEPROM functionally equivalent to the conventional stacked gate type EEPROM that can be formed through the standard CMOS process.

The object of this invention is to address the drawbacks of the current art and provide a nonvolatile memory cell that is produced with fewer process steps and thus more economically. Further object and advantages of the invention will become apparent from a consideration of the drawings and ensuing descriptions.

SUMMARY OF THE INVENTION

The present invention is an EEPROM cell having a unique configuration. The cell is comprised of a standard NMOS or PMOS type transistor connected to a Metal-Insulator-Metal (MIM), or Poly-Insulator-Poly (PIP) capacitor. The two devices form a floating gate between the gate of the first transistor and one terminal of the MIM or PIP capacitor. The floating gate stores electrical charge via Fowler-Nordheim tunneling (FN tunneling) in response to a voltage applied to the second terminal of the capacitor. The floating gate functions as a memory cell when floating gate charge is applied in the above manner. The capacitor may be deposited in a single layer of oxide by interlacing anode/cathode fingers of the capacitor in a horizontal plane with the oxide forming the dielectric between the fingers. Alternately, the capacitor may be formed by interconnecting the multiple fingers in multiple vertical layers.

BRIEF DESCRIPTION OF THE DRAWINGS

FIG. 5—General Memory Topology

FIG. 6—FN Write of EEPROM Cell

FIG. 7—CHE Write of EEPROM Cell

FIG. 8—Read of EEPROM Cell

FIGS. 9a and 9b—Erase of EEPROM Cell

FIG. 10—Oscilloscope Sweep of Unprogrammed Cell

FIG. 11—Oscilloscope Sweep of Programmed Cell

FIG. 12—Oscilloscope Sweep of Erase/Reprogrammed Cell

FIG. 13—MOS Varactor Structure

FIGS. 14a and 14b—MOS Varactor Used as Control Gate

DETAILED DESCRIPTION OF THE PREFERRED EMBODIMENTS

Description of Cell

Figure 2:
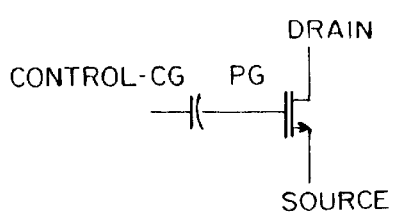
FIG. 2—Schematic Equivalent EEPROM Cell (prior art)
Figure 3:
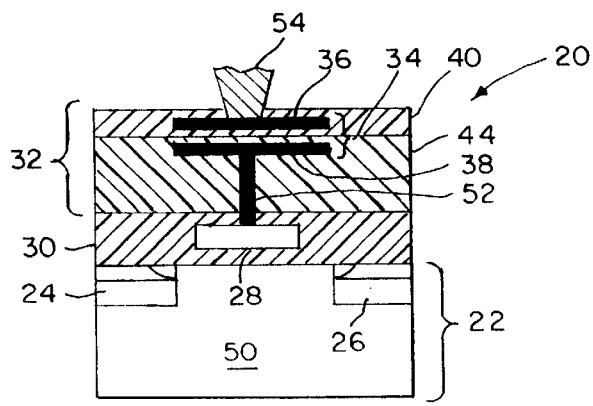
FIG. 3—Inventive EEPROM Structure

The present invention is an EEPROM cell, generally indicated at reference numeral 20, having a unique configuration, generally indicated in FIG. 3. It has been discovered that an EEPROM functionally equivalent to the conventional stacked gate type EEPROM shown in FIGS. 1 and 2 can be formed through the standard CMOS process. The inventive cell 20 is comprised of a first transistor 22 having a source 24, drain 26, and gate 28 with an oxide layer 30 over the gate 28 and a second transistor 32 having a source, drain, and gate formed by a Metal-Insulator-Metal (MIM), or Poly-Insulator-Poly (PIP) capacitor 34. The capacitor 34 has an upper plate 36 and a lower plate 38. Each capacitor plate is deposited in its own respective upper and lower oxide layer 40, 44 so as to be electrically isolated from each other and from a P-type substrate 50 of the first transistor 22. The lower plate 38 of the capacitor 34 is in electrical continuity with the gate 28 by way of a conventional via 52. The via 52 penetrates the lower oxide layer 44 and the gate oxide layer 30 to contact the gate 28 of the first transistor. The via 52 is formed in the conventional manner using standard CMOS flow technology and is preferably manufactured from tungsten metal. The lower plate 38 is spaced from the gate 28 by approximately 60,000 angstroms.

The above described morphology forms a floating gate between the gate 28 of the first transistor 22 and the lower plate 38 of the capacitor 34. The floating gate stores electrical charge via FN tunneling in response to a voltage applied to the upper plate 36 of the capacitor 34 by way of metal track 54. The floating gate functions as a memory cell when floating gate charge is applied in the above manner.

Figure 1:
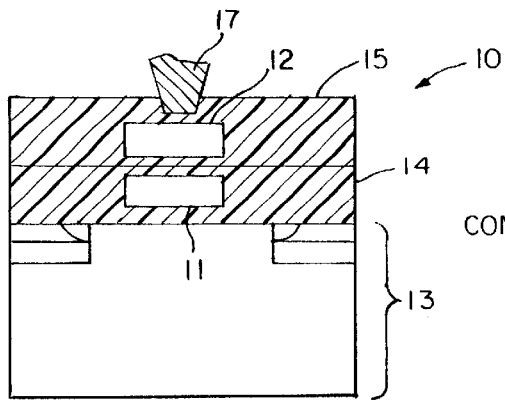
FIG. 1—Stacked Gate EEPROM Structure (prior art)

The cell 20 is functionally equivalent to the stacked cell structure shown in FIG. 1, which uses a capacitor in series with the gate of a transistor, as shown functionally in FIG. 2. That structure is a three terminal structure with control gate as the input (first terminal, or word line terminal, the source (second terminal), and the drain (third terminal) as the output, or bit line terminal.

In the invention shown in FIG. 3, the capacitor is formed by a MIM capacitor 34 with one of the plates 38 contacting the gate 28 of the transistor 22, and acts as the control gate of the cell. The contact to the poly does not typically occur over the transistor area. The poly gate 28 of the transistor 22 acts as the floating gate, where charge is stored in the memory cell. Since the poly gate of the transistor is embedded in an oxide 30, the leakage currents are very small, resulting in long term charge storage. In one embodiment of the present invention, the MIM is formed by two metal layers separated by a thin oxide 44, 40, which comprises both plates 36, 38 of the capacitor.

Figure 4:
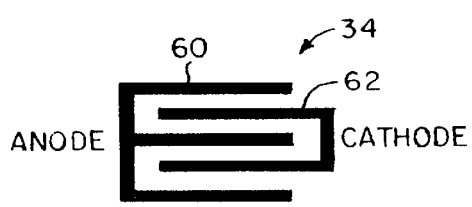
FIG. 4—Alternate Metal Capacitor Structure (top plan view)

In alternate embodiments, the metal capacitor 34 can be formed by using interlaced metal fingers 60, 62 on the same layer as shown in FIG. 4, or stacked, interlaced metal fingers 60, 62 with multiple metal layers. For a given capacitance, multiple metal layers require less space, an advantage where a denser cell is required. In each case, one plate of the MIM capacitor 34 will be in common with the floating gate 28, while the other will act as the control gate.

The MIM capacitor 34 and gate 28 to substrate 50 capacitances form a capacitive divider, which transfers control gate voltage to the floating gate voltage at the ratio of the two capacitors in a manner well known to those of ordinary skill in the art. If the ratio of control gate to floating gate capacitances is high (e.g., greater than two, preferably at least ten), lower input voltage and FN programming is possible.

As is well known by those of ordinary skill in the art, cell area is determined by the desired MIM/gate capacitance ratio and unit capacitance of the MIM. In either case, the MIM capacitor 34 may be placed over the storage transistor 22, with the gate 28 contacting the lower plate 38 of the MIM capacitor 34. By placing the capacitor 34 over the transistor 22, cell size is reduced.

In another alternate embodiment of the cell, the MIM capacitor can be replaced by a polycrystalline silicon-oxide insulator—polycrystalline silicon (PIP) capacitor. In this case the PIP can be constructed with the same variations as the MIM, that is, as two poly depositions separated by an oxide or by interlaced poly fingers as shown in FIGS. 3 and 4. An advantage to using PIP in the configuration is that it removes the metal to poly contact 52 for the gate 28, and thus frees up area over the cell for metal.

The general topology of the cell 20 for use in a memory application is organizing the control gate 12 as the word line and the drain 26 as the bit line, as shown in FIG. 5.

FIG. 6 shows the conditions for writing into the cell by FN tunneling. In this case, the source 24 and drain 26 of the transistor 22 is connected to ground, and the control gate 28 is raised to an elevated voltage (Vp) in the conventional manner dependent upon the technology used. By raising the voltage high enough to begin FN tunneling, electrons are injected from the n+ source/drain junctions 24, 26 into the floating gate 28 at a rate determined by the Vp and MIM/gate capacitance ratio and represents a linear function of Vp. Consequently, this operation can be used for storing intermediate values of charge on the floating gate, implying the storage of analog data.

FIG. 7 shows the alternate conditions for writing into the cell 20 by conventional Channel Hot Electron (CHE) injection. In this case, the source 24 is grounded, and drain 26 is raised to a high intermediate voltage Vd, and the gate 28 is raised to a high voltage Vp. At this time, a voltage determined by the Vp and MIM/gate capacitance ratio is generated on the floating gate electrode. Consequently, the transistor 22 is rendered highly conductive, and a high electric field occurs in the neighborhood of the N+ diffusion drain region, thereby generating hot electrons. Electrons accelerated by the electric field are injected from the N+ diffusion drain region into the gate electrode with the result that the gate electrode is negatively charged.

FIG. 8 shows the conditions for reading the cell 20. In this case the source 24 is grounded, the drain 26 is held at an intermediate voltage (on the order of 0.5 v), and the control gate 36 is held at VDD or another intermediate voltage. If the cell has not been written, no negative charge exists on the floating gate 28, and if the intermediate voltage on the control gate is higher than the unprogrammed threshold voltage of the transistor 22, it is held in the conductive or "on" state. If the cell has been written, the floating gate 28 has a negative charge, which increases the threshold at which the transistor 22 becomes conductive. If the intermediate voltage on the control gate is lower than the increased threshold voltage, the transistor 22 is in the non-conductive or "off" state. These conditions are sensed by conventional sense circuitry (not shown).

Erasing The Cell

Erasing the cell involves removing the negative charge that has been accumulated on the floating gate 28. FIG. 9b shows the conditions for the erase procedure. In this case, the source 24 is grounded, and the gate 28 and drain 26 terminals have the opposite polarity as in the FN write procedure as shown in FIG. 9b, i.e., the gate is grounded and the drain is raised to Vp. This operation places a high electric field across the terminals causing FN tunneling to remove the charge accumulated on the floating gate. Once the charge is removed, the data is erased.

In the case where Vp exceeds the drain to bulk breakdown voltage, the gate and drain voltage may be lowered together such that the Vp is less than the drain/bulk breakdown. This condition usually results in a negative gate voltage. The cell is inherently able to go to negative voltages since there are no junctions on this terminal.

Properties of the Cell (Example 1)

FIG. 10 shows a sweep of the unprogrammed properties for the cell using a 0.25 u, CMOS technology, with MIM/gate capacitance ratio of 5/1. Note that the voltages given are by way of example in this figure as well as FIG. #11 and FIG. #12. In this case, the source is held at 0V, the drain at 0.5V, and the gate is swept from 0 to 5V, and the drain current is read. The measured threshold voltage Vt of this unprogrammed cell is 0.5V.

FIG. 11 shows the programmed properties for the cell using the same technology and read conditions. In this case, the cell was programmed with a Vp of 9V using the FN programming technique described above. It is seen that the programmed cell has Vt significantly greater than that of the unprogrammed case, which demonstrates the memory properties of the cell. Using progressively lower Vp, lowers the value of the Vt. The proper Vp is selected depending on the gate oxide thickness and operating conditions of the memory.

FIG. 12 shows the erased and reprogrammed properties for the cell using the same technology and read conditions. In this case, the cell was erased with a Vd of 4V, and Vp of −5V using the FN erase technique described above. It is seen that the erased cell has Vt near that of the unprogrammed case. Using progressively higher Vp, raises the value of the Vt. As mentioned in the program section above the proper (erase) Vp is selected depending on the gate oxide thickness and operating conditions of the memory.

Another alternative is the use of an accumulated MOS varactor in place of the PIP or MIM. A cross section of the varactor device 63 is shown in FIG. 13. In this case, the gate poly 28 of the transistor 22 is connected to the gate poly of the varactor, as shown in FIGS. 14a and 14b, and an N+ well 64 is the control gate input. The disadvantage of this implementation is that the N+ well voltage is limited to voltages greater than about −0.7V by P substrate to N+ well junction.

Advantages of the Invention

An advantage of the present invention is that it is compatible with the standard CMOS process. The standard CMOS process entails a one-layer polysilicon deposition step while the typical EEPROM cell requires two polysilicon deposition steps to form the floating gate and control gate as well as a step for the deposition of a thin oxide layer between the two polysilicon layers. These additional process steps are not appropriate for non-memory applications, and add to the expense in production of the cells. In the present invention, the MIM capacitor is not required to be imbedded. Thus the invention fills a need for an EEPROM functionally equivalent to the conventional stacked gate type EEPROM that can be formed through the standard CMOS process. The memory cells of the present invention can be produced more economically than in standard EEPROM process.

Another advantage of the invention is that in the embodiment of the present invention where the MIM is formed by two metal layers separated by a thin oxide or by interlaced metal fingers with multiple metal layers, a more dense cell can be formed. This is the case because for a given capacitance multiple metal layers require less space. Cell area is determined by the desired MIM/gate capacitance ratio and unit capacitance of the MIM. In either case, the MIM may be placed over the storage transistor, with the gate contacting the lower plate of the MIM. By placing the capacitor over the transistor, cell size is reduced. This is desirable where a denser cell is required. In another alternate embodiment of the cell, the MIM capacitor can be replaced by a PIP. In this case the PIP can be constructed with the same variations as the MIM, that is, as two poly depositions separated by an oxide or by interlaced poly fingers as shown in FIG. 3 and 4. An advantage to using PIP in the configuration is that it removes the metal1 to poly contact for the gate, and thus frees up area over the cell for metal.

A further advantage is that control gate voltage may be minimized through a high control gate capacitance to floating gate capacitance ratio. The MIM and gate capacitances form a capacitive divider, which transfers control gate voltage to the floating gate voltage at the ratio of the two capacitors. If the ratio of control gate to floating gate capacitances is high, lower input voltage and FN programming is possible.

Conclusions, Ramifications, and Scope

While the invention has been described in conjunction with specific embodiments, it is evident that many alternatives, modifications and variations will be apparent to those skilled in the art in light of the foregoing description. Accordingly, it is intended to embrace all such alternatives, modifications and variation as fall within the spirit and scope of the appended claims and their equivalents.

Those of ordinary skill in the art will conceive of other alternate embodiments of the invention upon reviewing this disclosure. Thus, the invention is not to be limited to the above description, but is to be determined in scope by the claims which follow.

We claim:

1. An electrically erasable, programmable read-only memory cell, comprising:
   a first insulated gate metal-oxide semiconductor having a source region and a drain region in a substrate, and further having an insulated gate deposited in a first oxide layer above the substrate;
   a first conductive plate located above the insulated gate, the first conductive plate being electrically isolated in its own oxide layer;
   a second conductive plate located above the first conductive plate and being electrically isolated therefrom and from the insulated gate in its own oxide layer such that the first and second conductive plates form a capacitor having a capacitance substantially greater than an inherent capacitance between the insulated gate and the substrate so as to define a capacitance ratio;

commutating means for electrically commutating the first conductive plate with the insulated gate so as to form a floating gate; and, electrical contact means for charging the capacitor.

2. The electrically erasable, programmable read-only memory cell of claim 1, wherein each capacitor plate has multiple electrically interconnected fingers, and the fingers of each plate are relatively interposed with one another in a spaced apart relationship with insulating layers therebetween.

3. The electrically erasable, programmable read-only memory cell of claim 2, wherein the fingers are arranged vertically, one above another and an insulating oxide layer separates each of the fingers.

4. The electrically erasable, programmable read-only memory cell of claim 1, wherein the capacitance ratio is at least ten.

5. The electrically erasable, programmable read-only memory cell of claim 1, wherein the electrical commutating means is a substantially vertical via passing through the insulated gate oxide layer and first conductive plate oxide layer.

6. The electrically erasable, programmable read-only memory cell of claim 5, wherein the via is manufactured from Tungsten metal.

7. The electrically erasable, programmable read-only memory cell of claim 1, wherein the electrical contact means is a surface metal track on the second conductive plate oxide layer.

8. The electrically erasable, programmable read-only memory cell of claim 1, wherein the substrate is a P type material.

9. The electrically erasable, programmable read-only memory cell of claim 1, wherein the cell is part of a memory cell array.

10. The electrically erasable, programmable read-only memory cell of claim 1, including means for providing the capacitor with variable capacitance.

11. An electrically erasable, programmable read-only memory cell, comprising:

a first insulated gate metal-oxide semiconductor having a source region and a drain region in a substrate, and further having an insulated gate deposited in a first oxide layer above the substrate;

first and second conductive plates located above the insulated gate, wherein the first and second conductive plates form a capacitor having a capacitance substantially greater than an inherent capacitance between the insulated gate and the substrate so as to define a capacitance ratio, and wherein each capacitor plate has multiple electrically interconnected fingers, and the fingers of each plate are relatively interposed with one another in a spaced apart relationship with insulating layers therebetween;

commutating means for electrically commutating the first conductive plate with the insulated gate so as to form a floating gate; and, electrical contact means for charging the capacitor.

12. The electrically erasable, programmable read-only memory cell of claim 11, wherein the fingers are arranged vertically, one above another and an insulating oxide layer separates each of the fingers.

13. The electrically erasable, programmable read-only memory cell of claim 11, wherein the capacitance ratio is at least ten.

14. The electrically erasable, programmable read-only memory cell of claim 11, wherein the electrical commutating means is a substantially vertical via.

15. The electrically erasable, programmable read-only memory cell of claim 14, wherein the via is manufactured from Tungsten metal.

16. The electrically erasable, programmable read-only memory cell of claim 11, wherein the electrical contact means is a surface metal track in electrical contact with the second conductive plate.

17. The electrically erasable, programmable read-only memory cell of claim 11, wherein the substrate is a P type material.

18. The electrically erasable, programmable read-only memory cell of claim 11, wherein the cell is part of a memory cell array.

19. The electrically erasable, programmable read-only memory cell of claim 11, including means for providing the capacitor with variable capacitance.

* * * * *